United States Patent

[11] 3,593,197

[72] Inventor Ricardo A. Carreras
Plantation, Fla.
[21] Appl. No 815,848
[22] Filed Apr. 14, 1969
[45] Patented July 13, 1971
[73] Assignee Honeywell Inc.
Minneapolis, Minn.

[54] RELAXATION OSCILLATOR
3 Claims, 3 Drawing Figs.

[52] U.S. Cl. .......... 331/111, 307/301
[51] Int. Cl. .......... H03k 3/26
[50] Field of Search .......... 331/111; 307/301

[56] References Cited
UNITED STATES PATENTS
3,365,651 1/1968 Rolfes .......... 331/111

OTHER REFERENCES
G. E. NOTES ON UNIJUNCTION TRANSISTOR pg. 9 May 61 307-301
Nickus, ELECTRONICS, Nov. 14, 1965, pg. 122, 331-111
ELECTRONICS, July 11, 1966 pg. 83 331-111

*Primary Examiner*—John Kominski
*Attorneys*—Arthur H. Swanson and Lockwood D. Burton

ABSTRACT: A relaxation oscillator is disclosed wherein a capacitor is periodically charged and discharged to generate an output signal across the capacitor. A three terminal semiconductor means such as a unijunction transistor, is used to provide a discharge path for the capacitor, the unijunction transistor discharging the capacitor whenever a sufficient voltage is accumulated on the capacitor to forward bias the discharge path. An AC modulating the bias voltage applied to the unijunction transistor, thereby the magnitude of voltage necessary to forward bias the discharge path is also modulated.

INVENTOR.
RICARDO A. CARRERAS
BY Lockwood D. Burton
ATTORNEY.

RELAXATION OSCILLATOR

The present invention relates to relaxation oscillators, and more particularly to an improved relaxation oscillator employing three terminal semiconduction means, such as a unijunction transistor.

A unijunction transistor is s three terminal semiconductor device having a single rectifying electrode, called a junction electrode, disposed intermediately between a pair of spaced ohmic electrodes, called base electrodes. The base electrodes of the unijunction transistor serve, respectively, as output and common terminals while the junction electrode serves as an input terminal.

A unijunction transistor has several different and distinct regions or operation. These regions may be classified into the cutoff region of operation, the negative resistance region of operation and the saturation region of operation. The transfer characteristic of a unijunction transistor may be represented by a plot of junction voltage versus junction current. In the cutoff region of operation the junction electrode is reverse biased to oppose current flow and the plot of junction voltage versus junction current is a steep upward sloping curve. A unwanted current, called leakage current, flows through the junction electrode in this cutoff region of operation, and the magnitude of the leakage current varies directly with the magnitude of the voltage impressed on the junction electrode. As the voltage on the junction electrode is gradually increased, a given peak point value $V_p$ will be reached whereat the junction electrode becomes forward biased. At this point the unijunction transistor breaks down and switches from the cutoff to the negative resistance region of operation. The peak point current $I_p$ flows through the junction electrode when the junction voltage reaches $V_p$. Thus, it may be said that in the cut off region of operation that the leakage current flowing or being drained through the reverse biased junction electrode of a unijunction transistor will increase up to a maximum valve $I_p$. At that time the junction electrode will become forward biased and the unijunction transistor will break down. It is noted that the given value of voltage necessary to forward bias the junction electrode is a function of the geometry of the unijunction transistor and the bias potential applied across its base electrodes.

As above-mentioned, once the junction electrode is forward biased the unijunction transistor will operate in its negative resistance region of operation. The junction voltage versus current curve in this region slopes downward until a zero slope point, called the valley point, is reached. The junction voltage and current at the valley point are designated, $V_r$ and $I_r$, respectively. Once the junction current has increased to $I_r$ and the junction voltage has dropped to $V_r$, the unijunction transistor then enters the saturation region of operation. The junction electrode remains forward biased in this region of operation and the plot of junction voltage versus current takes the form of a gradual upward sloping curve.

Heretofore, relaxation oscillators have been devised which employed unijunction transistor. A typical example of such an oscillator is shown and described by Suran in U.S. Pat. No. 2,826,696. The circuit disclosed therein employs a unijunction transistor with a capacitor connected between its junction electrode and one of its base electrodes. Conventional means are included for continuously charging the capacitor at a predetermined rate, and a bias voltage is applied across the base electrodes of the unijunction transistor. In operation, charge is continuously accumulated on the capacitor in this circuit until the voltage impressed on the junction electrode reaches the peak point voltage $V_p$ of the unijunction transistor. At that instant, the junction electrode will become forward biased, and the operation of the unijunction transistor shifts from cut off to its negative resistance region of operation. As a result, the capacitor is rapidly discharged through the junction electrode. Once the capacitor is substantially discharged, the junction electrode again will become reverse biased and the capacitor is recharged. This sequence of charging and discharging the capacitor then repeats itself; thereby a a sawtooth output signal is generated across the capacitor. It is noted that in such oscillators the frequency of the output signal generated is proportional to the rate at which the capacitor is charged. For example, an output signal of a higher frequency may be produced by charging the capacitor at a faster rate.

The above-described prior art oscillators, however, have the disadvantage that they have a lower frequency limit below which they will not operate. This frequency limitation is due to the leakage current drawn by the junction electrode of the unijunction transistor in the cut off region of operation. For example, it may be determined that in order to produce a certain low frequency output signal the capacitor must be charged at a rate which is less than the maximum value of leakage current $I_p$ which will be drawn by the junction electrode. In these prior art oscillators, the capacitor would only be charged up to the voltage point whereat the leakage current being drained through the junction electrode equaled the current charging the capacitor. Thereafter, all charge supplied to the capacitor would be leaked through the junction electrode, and consequently, the voltage on the capacitor would not be further increased. Therefore, a voltage sufficient to forward bias the junction electrode would never be accumulated on the capacitor, and such an oscillator would not generate a pulsating output signal.

It is, accordingly, and object of the present invention to provide an improved relaxation oscillator employing a three terminal semiconductor means, such as a unijunction transistor or the like, which obviates the disadvantages of the above-described prior art oscillators.

It is, further, and object of the present invention to provide a relaxation oscillator as set forth which is characterized by being operable to generate output signals of very low frequencies.

In accomplishing these and other objects, there has been provided, in accordance with the present invention, a relaxation oscillator employing a unijunction transistor, or the like. A charge storage means is connected between the junction electrode of the unijunction transistor and one of its base electrodes. A current source is connected across the storage means to continuously charge the storage means at a predetermined rate. DC bias means are connected across the base electrodes of the unijunction transistor to establish a potential gradient therein. Means are provided for superimposing a relatively small AC signal on the DC bias whereby to modulate the potential gradient applied across the base electrodes, and correspondingly, the bias potential influencing the junction electrode. Thereby, the value of peak point voltage $V_p$ at which the junction electrode forward biases is varied about a median value. The lowest value to which $V_p$ is varied is preset to be less than the voltage to which the storage means is charged after a predetermined interval of time. Thereby, the voltage impressed on the junction electrode will periodically exceed the instanteous value of $V_p$, and the junction electrode will be forward biased. The capacitor will then discharge through the forward biased junction electrode. In this manner, output pulses are generated across the capacitor terminals. A relaxation oscillator is, thus, provided in which the value of junction voltage necessary to forward bias the junction electrode may be set to a predetermined value less than the median value of the peak point voltage $V_p$ for the unijunction transistor. Such an oscillator is therefore particularly suitable for producing low frequency output signals requiring the use of extremely low charging currents or so called flat ramps.

A better understanding of the invention may be had from the following detailed description when read in connection with the accompanying drawings in which.

Figure 1:
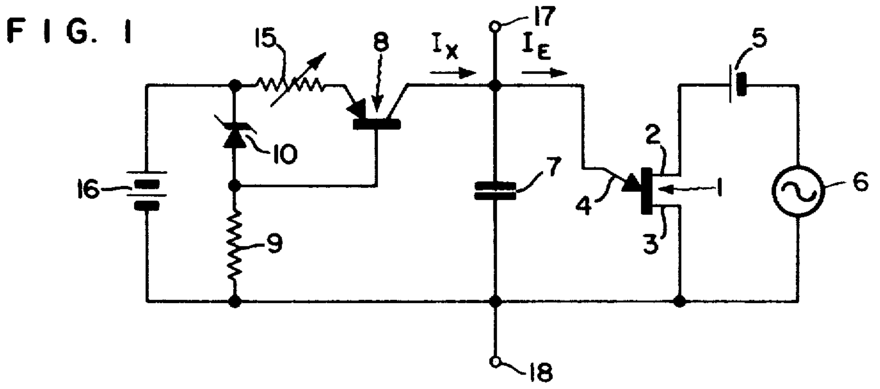
FIG. 1 is a circuit diagram of a relaxation oscillator according to the present invention.

Referring to the drawings in more detail, there is shown in FIG. 1 a unijunction transistor 1 having base electrodes 2 and 3 and a junction electrode 4. The positive terminal of a DC bias means, or battery, 5 is connected to the base electrode 2. An AC signal generator or modulating means 6 is connected from the negative terminal of the battery 5 to the base electrode 3. Connected between the junction electrode 4 and the base electrode 3 is a charge storing means or capacitor 7. Connected to the opposite electrodes of the capacitor 7 are output terminals 17 and 18. The terminals 17 and 18 are connected, respectively, to the unijunction electrodes 4 and 3.

A constant current source comprised of a transistor 8, a resistor 9, a zener diode 10, a variable resistor 15 and a battery 16 is connected across the capacitor 7. The collector electrode of the transistor 8 is connected to the terminal of the capacitor 7 common with the output terminal 17. The emitter electrodes of the transistor 8 is connected through the variable resistor 15 to the positive terminal of the battery 16. The zener diode 10 is connected across the battery 16 in a conventional manner to provide a constant voltage drop thereacross. One terminal of the diode 10 is connected directly to the positive terminal of the battery 16 while the other terminal of the diode 10 is connected through the resistor 9 to the negative terminal of the battery 16. The base electrode of the transistor 8 is connected to the junction between the resistor 9 and the zener diode 10, and the negative terminal of the battery 16 is connected to the terminal 18.

Figure 2:
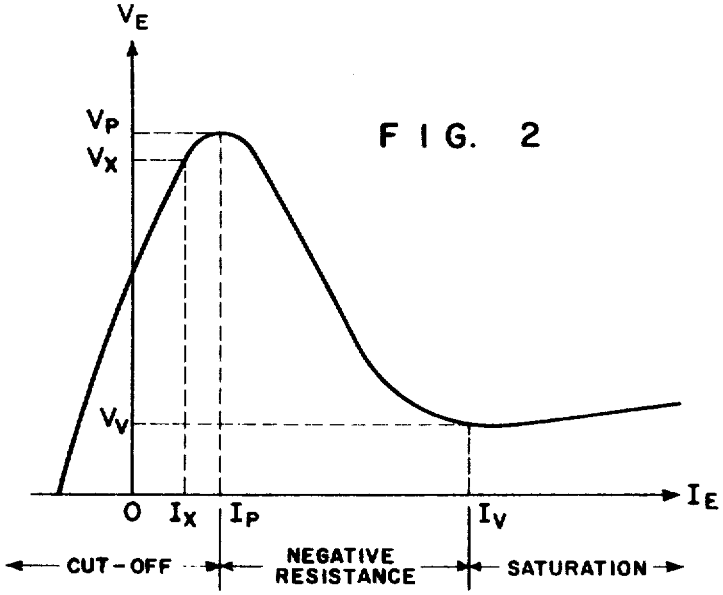
FIG. 2 is a graphic representation of the relationship between junction voltage and junction current for a unijunction transistor.

FIG. 2 shows the plot of the junction voltage $V_E$ versus the junction current $I_E$ for the unijunction transistor 1. The curve is drawn for the condition where the constant bias voltage provided by the battery 5 is applied across the base electrodes 2 and 3. A value of charging current $I_X$ is indicated on the FIG. 2 which is predetermined to be less than the maximum leakage current $I_p$ which may be drawn by the unijunction transistor 1 in its cutoff region of operation.

In operation of the exemplary oscillator, a constant current is supplied to the circuit of FIG. 1 by the current source comprised of the transistor 8. The zener diode 10 operates in this circuit to clamp the DC bias voltage applied between the emitter and the base electrodes of the transistor 8, thereby a constant current will flow through the emitter-collector path of the transistor 8. The magnitude of this constant current may be set to a desired value by adjusting the value of resistance of the variable resistor 15. For purposes of illustration this constant current is set to have the value $I_X$, which is a slow charge rate or flat ramp. The current $I_X$, is shown in FIG. 1 charging the capacitor 7.

Also indicated in FIG. 1 is the junction current $I_E$ which flows through the junction electrode 4. The value of the junction current $I_E$ is dependent upon the region in which the unijunction transistor 1 is operating and the value of voltage $V_p$ impressed on the junction electrode 4. In the cut off region of operation, the current $I_E$ is called a leakage current $I_E$ constitutes a drainage of charge from the capacitor 7.

Initially, it is assumed that the capacitor 7 is completely discharged. Consequently, no voltage is applied to the junction electrode 4 and the electrode 4 is reverse biased. Thus, the unijunction transistor 1 is operating in the cutoff region of operation. The capacitor 7 then will be charged by the charging current $I_X$ at a rate determined by the excess of the value of the current $I_X$ over the leakage current $I_E$. Referring to FIG. 2, it can be seen that with only the constant bias supplied by the battery 5, the capacitor 7 would only be charged to the voltage $V_X$ whereat the leakage current would equal the charging current $I_X$.

In the circuit of FIG. 1, however, an AC signal generator 6 is connected in series with the battery 5 to superimpose a relatively small AC signal on the constant bias voltage provided by the battery 5 across the base electrodes 2 and 3. As a result, the bias potential gradient applied across the base electrodes 2 and 3 of the unijunction transistor 1 is AC modulated by the signal generator 6. Thereby, the bias potential influencing the junction electrode 4 is also modulated. The amount of AC modulation is predetermined to be sufficient to shift or vary the peak voltage point $V_p$ to a low value point slightly less than the voltage $V_X$. As a result, the junction electrode 4 will become forward biased whenever the capacitor 7 has been charged to the voltage $V_X$ and the modulated peak point voltage $V_p$ reaches its lowest value. At that instant, the capacitor 7 is rapidly discharged through the forward biased junction electrode 4. Once the capacitor 7 is substantially discharged, the junction electrode 4 again becomes reverse biased and the charging-discharging cycle of the capacitor 7 is repeated. Thus, a periodic output signal is produced across the output terminals 17 and 18, which is characterized in that the period is longer then is otherwise obtainable with the hereinbefore mentioned prior art circuits.

Figure 3:
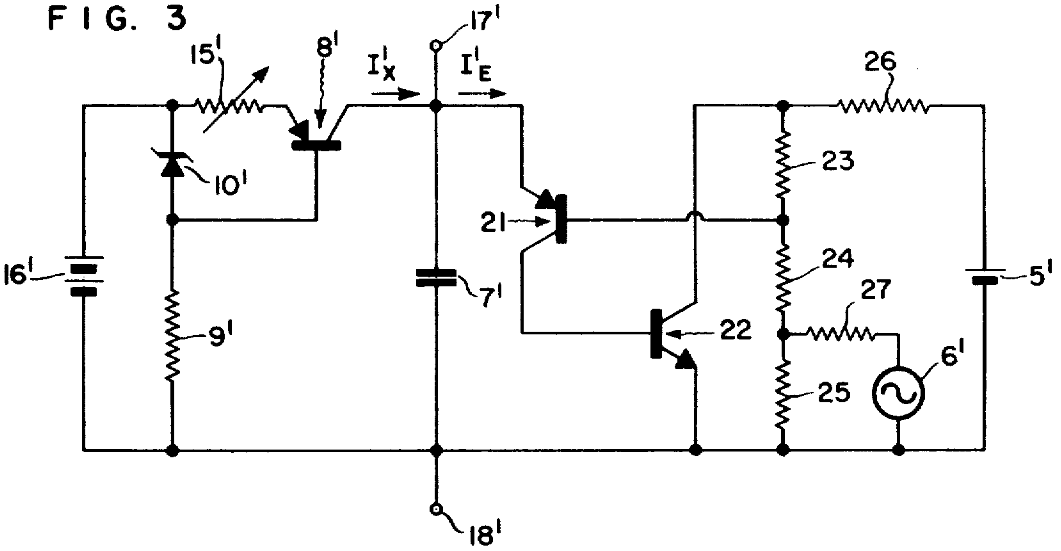
FIG. 3 is a circuit diagram of an alternate form of relaxation oscillator according to the present invention.

FIG. 3 illustrates an alternate form of relaxation oscillator according to the present invention. The circuit of FIG. 3 is similar to that of FIG. 1 except the oscillator of FIG. 3 includes a pair of junction transistors 21 and 22 in place of the unijunction transistor 1. The transistors 21 and 22 are of the PNP and NPN type, respectively, and are connected in such a way as to provide, effectively, a three terminal semiconductor means which operates in a manner similar to that of the unijunction transistor 1. The emitter electrode of the transistor 21 corresponds, in function, with the junction electrode 4 of the unijunction transistor 1. The base electrode 21 corresponds, in function, with the unijunction base electrode 2, and the emitter electrode of the transistor 22 corresponds, in function, with the unifunction base electrode 3. Additionally, to the extent that the elements of the circuit shown in FIG. 3 corresponds further with the elements of the circuit of FIG. 1, the components of FIG. 3 are identified by corresponding numerals with primes added.

There is shown in FIG. 3 a charge storing means, or capacitor, 7′. Connected across the capacitor 7′ is a constant current source comprised of a transistor 8′, a resistor 9′, a zener diode 10′, a variable resistor 15′, and a battery 16′. The constant current source is connected in the same manner as the current source of FIG. 1. A pair of output terminals 17′ and 18′ are connected, respectively, to the opposite electrodes of the capacitor 7′.

Connected to the output terminal 17′ is the emitter electrode of the PNP transistor 21. The collector electrode of the transistor 21 is connected to the base electrode of the NPN transistor 22. The emitter electrode of the transistor 22 is connected to the output terminal 18′. A voltage divider network, comprising series-connected resistors 23, 24 and 25, is connected across the emitter and collector electrodes of the transistor 22. The remote ends of the resistors 23 and 25 are connected, respectively, to the collector and emitter electrodes of the transistor 22. The base electrode of the transistor 21 is connected to the junction between the resistors 23 and 24.

A constant bias voltage provided by a battery 5′ is applied across the voltage divider network comprised of the resistors 23, 24 and 25. The positive terminal of the battery 5′ is connected through a resistor 26 to the remote end of the resistor 23 while the negative terminal of the battery 5′ is connected to the remote end of the resistor 25. An AC signal generator, or modulating means, 6′ is connected in series with a resistor 27. The series connected signal generator 6′ and resistor 27 are connected between the negative terminal of the battery 5′ and the junction between the resistors 24 and 25.

In operation, the combination of the transistors 21 and 22 in the oscillator of FIG. 3 provides a circuit which behaves in much the same manner as the unijunction transistor 1 of FIG. 1. Therefore, in explaining the operation of the circuit of FIG. 3 reference will be made to voltages and currents corresponding to those indicated on the curve of FIG. 2. A prime is added to identify those current and voltages associated with the oscillator of FIG. 3.

Assuming that the capacitor 7′ is initially discharged, no voltage is impressed on the emitter electrode of the transistor 21. At this instant, the emitter-collector current path of the transistor 21 is biased to be substantially nonconductive by the bias voltage applied to the base electrode of the transistor 21. This region of operation of the transistors 21 and 22 corresponds to the cutoff region of operation of a unijunction transistor. The capacitor 7' will be charged in this region by the charging current $I'_X$ supplied by the transistor 8'. As charge accumulates on the capacitor 7', a low value leakage current $I'_E$ will flow through the emitter-collector path of the transistor 21 and the base-emitter path of the transistor 22. The magnitude of the leakage current varies directly with the magnitude of the voltage impressed on the emitter electrode of the transistor 21, just as the leakage current flowing through the junction electrode of a unijunction transistor depends on the voltage impressed on its junction electrode. The rate at which the capacitor 7' is charged, consequently will be determined by the amount by which the charging current $I'_X$ exceeds the value of the leakage current $I'_E$.

In order to get a slow charge rate or flat ramp, the charging current is set at a low value which happens to be less than the maximum leakage current $I'_E$ which would be drawn by the transistor 21 with the constant bias potential derived from the battery 5' impressed on the base electrode of the transistor 21. The capacitor 7', therefore, would charge only to a specific voltage which is not sufficient to bias the emitter-collector path of the transistor 21 in to low resistance conduction. An AC signal generator 6', however, superimposes an AC potential across the resistor 25, and thereby AC modulates the bias potential applied to the base electrode of the transistor 21. The magnitude of this AC modulation is determined to be sufficient to shift the bias voltage on the base electrode of the transistor 21 to a low point whereat the specific voltage on the transistor emitter electrode will be sufficient to bias the transistor 21 into low resistance conduction. As a result, the emitter-collector path of the transistor 21 will be biased into low resistance conduction whenever the capacitor 7' has been charged to this specific voltage and the modulated bias voltage on the transistor base reaches its lowest point. At that instant, the capacitor 7' is rapidly discharged through the emitter-collector path of the transistor 21 and the base-emitter current path of the transistor 22. Once the capacitor 7' is substantially discharged, the emitter-collector current path of the transistor 21 again becomes substantially nonconductive, and the charging-discharging cycle of the capacitor 7' is repeated. Therefore, a periodic output signal is produced across the output terminals 17' and 18'.

Thus, there has been provided an improved relaxation oscillator employing a three terminal semiconductor means, such as a unijunction transistor or the like, which is particularly suitable for producing low frequency output signals requiring the use of extremely low charging currents or flat ramps.

The embodiments of the invention in which an exclusive property or privilege is claimed are defined as follows:

I claim:

1. A relaxation oscillator wherein a capacitor is periodically charged and discharged so that an output signal is generated across said capacitor, comprising in combination with said capacitor:

charging means connected across said capacitor for continuously charging said capacitor whereby to accumulate a capacitor voltage thereon;

a semiconductor means having first, second and third terminals, said first and second terminals defining a controllably conductive current path, said capacitor being connected between said first and second terminals for applying said capacitor voltage across said current path, said capacitor being charged by said charging means at a rate which is less than the maximum value of the leakage current which will be drawn by the said first terminal, said current path having a low resistive conductive state for discharging said capacitor whenever forward biased by said capacitor voltage and otherwise a high resistive substantially nonconductive state, the magnitude of said capacitor voltage necessary to forward bias said current path being proportional to the instant bias potential applied across said second and third terminals;

means for connecting said second and third terminals to a constant DC voltage source whereby to establish a substantially constant bias potential across said second and third terminals; and AC signal generating means coupled across said second and third terminals for superimposing an AC signal on the constant bias potential applied thereacross whereby to AC modulate the instant bias potential applied across said second and third terminals and correspondingly vary the magnitude of said capacitor voltage necessary to forward bias said current path.

2. The invention recited in claim 1 wherein said semiconductor means comprises a unijunction transistor, said first terminal being the junction electrode of said unijunction transistor, and said second and third terminals being the base electrodes of said unijunction transistor.

3. The invention recited in claim 1 wherein said semiconductor means comprises the combination of a PNP junction transistor interconnected with an NPN junction transistor, the collector electrode of said PNP transistor being coupled to the base electrode of said NPN transistor, the base electrode of said PNP transistor being coupled to the collector electrode of said NPN transistor, said first terminal being the emitter electrode of said PNP transistor, said second terminal being the emitter electrode of said NPN transistor, and said third terminal being the base electrode of said PNP transistor.